US010917083B2

(12) United States Patent
Masuhara et al.

(10) Patent No.: US 10,917,083 B2
(45) Date of Patent: Feb. 9, 2021

(54) DRIVE CIRCUIT FOR SEMICONDUCTOR ELEMENT

(71) Applicant: Mitsubishi Electric Corporation, Tokyo (JP)

(72) Inventors: Takashi Masuhara, Tokyo (JP); Takeshi Horiguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/605,219

(22) PCT Filed: Jun. 13, 2017

(86) PCT No.: PCT/JP2017/021762
§ 371 (c)(1),
(2) Date: Oct. 15, 2019

(87) PCT Pub. No.: WO2018/229856
PCT Pub. Date: Dec. 20, 2018

(65) Prior Publication Data
US 2020/0127657 A1  Apr. 23, 2020

(51) Int. Cl.
H03K 17/082 (2006.01)
(52) U.S. Cl.
CPC .................. H03K 17/0826 (2013.01)
(58) Field of Classification Search
CPC ............. H03K 17/082; H03K 17/0822; H03K 17/0826; H03K 17/0828
(Continued)

(56) References Cited

U.S. PATENT DOCUMENTS 5,375,029 A    12/1994  Fukunaga et al.
6,046,611 A     4/2000  Morishima
(Continued)

FOREIGN PATENT DOCUMENTS

CN   102200558 A    9/2011
CN   204835517 U   12/2015
(Continued)

OTHER PUBLICATIONS

Indian Office Action dated Aug. 7, 2020, issued in corresponding Indian Patent Application No. 201947047481.
(Continued)

Primary Examiner — Tomi Skibinski
(74) Attorney, Agent, or Firm — Xsensus LLP

(57) ABSTRACT

A drive circuit includes: a signal generation circuit; a comparator; a comparator; and a short circuit determination unit. The signal generation circuit is configured to generate, as an output signal, a differential amplification signal of a voltage detection signal indicating a gate voltage of a semiconductor element and a delay signal of the voltage detection signal. The comparator is configured to compare a value of the differential amplification signal with a first reference voltage value. The comparator is configured to compare a voltage value indicating a gate current with a second reference voltage value. The short circuit determination unit is configured to determine whether or not the semiconductor element is in a short-circuited state, based on a result of comparison by each of the comparators, and generate a determination signal indicating a determination result.

9 Claims, 12 Drawing Sheets

(58) Field of Classification Search
USPC .... 327/108–112, 427, 434, 437; 326/82, 83, 326/87
See application file for complete search history.

(56) References Cited

U.S. PATENT DOCUMENTS

| | | | |
|---|---|---|---|
| 2010/0231269 A1* | 9/2010 | Nakatake | H03K 17/08128 327/109 |
| 2011/0234192 A1 | 9/2011 | Tong | |
| 2018/0115310 A1* | 4/2018 | Horiguchi | H03K 17/168 |

FOREIGN PATENT DOCUMENTS

| | | | |
|---|---|---|---|
| EP | 2961047 A1 | 12/2015 |
| JP | 6-120787 A | 4/1994 |
| JP | 11-214972 A | 8/1999 |
| JP | 2003-143833 A | 5/2003 |
| JP | 2009-225506 A | 10/2009 |
| JP | 2013-123329 A | 6/2013 |
| JP | 2015-053749 A | 3/2015 |
| JP | 5780145 B2 | 9/2015 |
| WO | 2007/116900 A1 | 10/2007 |
| WO | 2014/128951 A1 | 8/2014 |
| WO | 2016/203937 A1 | 12/2016 |

OTHER PUBLICATIONS

International Search Report and Written Opinion dated Jul. 25, 2017 for PCT/JP2017/021762 filed on Jun. 13, 2017, 10 pages including English Translation of the International Search Report.
Notification of Reasons for Refusal received for Japanese Patent Application No. 2017-553273, dated Nov. 21, 2017, 8 pages including English Translation.
Office Action dated Dec. 14, 2020, in corresponding Chinese patent Application No. 201780091742.1, 9 pages.

* cited by examiner

DRIVE CIRCUIT FOR SEMICONDUCTOR ELEMENT

CROSS-REFERENCE TO RELATED APPLICATION

The present application is based on PCT filing PCT/JP2017/021762, filed Jun. 13, 2017, the entire contents of which are incorporated herein by reference.

TECHNICAL FIELD

The present invention relates to a drive circuit for a semiconductor element, and particularly to a drive circuit having the function of determining a short-circuited state of a semiconductor element.

BACKGROUND ART

When a short-circuited state occurs in a power semiconductor element such as an IGBT (Insulated Gate Bipolar Transistor) or a MOSFET (Metal Oxide Semiconductor Field Effect Transistor), a large current may flow and the semiconductor element may be thermally destructed. Therefore, the function of determining the short-circuited state of the semiconductor element is required.

A drive circuit described in Japanese Patent Laying-Open No. 2013-123329 (PTL 1) determines that a semiconductor element is short-circuited, when a collector current of the semiconductor element is larger than a preset reference value and a gate current flowing through the semiconductor element is smaller than a preset reference value. Particularly, the collector current flowing through the semiconductor element is detected based on a voltage across a shunt resistor connected to a sense cell of the semiconductor element, and thus, a short-circuited state can be determined without increasing a breakdown voltage of the circuit, even when a high voltage is applied between a positive electrode-side terminal and a negative electrode-side terminal of the semiconductor element.

A drive circuit described in Japanese Patent Laying-Open No. 2009-225506 (PTL 2) detects a gate current flowing from the drive circuit to a semiconductor element, and determines that the semiconductor element is short-circuited, when the gate current becomes smaller than a negative reference value within a short circuit detection period from the moment when the gate current becomes larger than a positive reference value. When a large current such as a short circuit current flows through the semiconductor element, a gate voltage becomes higher than a voltage controlled by the drive circuit and a current flows from the semiconductor element to the drive circuit. That is, the current flows in a direction opposite to the gate current for turning on the semiconductor element. Therefore, by checking whether the gate current in the on state swings in a positive or negative direction, a short-circuited state can be determined.

CITATION LIST

Patent Literature

PTL 1: Japanese Patent Laying-Open No. 2013-123329
PTL 2: Japanese Patent Laying-Open No. 2009-225506

SUMMARY OF INVENTION

Technical Problem

However, in the drive circuit described in Japanese Patent Laying-Open No. 2013-123329, the sense cell of the semiconductor element and the shunt resistor are used to determine a short circuit of the semiconductor element without increasing the breakdown voltage of the drive circuit. Therefore, the drive circuit is not applicable when the semiconductor element is not provided with the sense cell.

In the drive circuit described in Japanese Patent Laying-Open No. 2009-225506, when the large current flows through the semiconductor element, the current flowing in the direction opposite to the gate current for turning on the semiconductor element is usually small. Furthermore, it is necessary to detect that the gate current becomes smaller than the negative reference value within the short circuit detection period. Therefore, determination of the short-circuited state is difficult.

The present invention has been made to solve the above-described problem, and an object of the present invention is to provide a drive circuit for a semiconductor element, which does not require a sense cell of the semiconductor element, is applicable to a wide variety of semiconductor elements, and can determine a short-circuited state of the semiconductor element easily and at high speed.

Solution to Problem

A drive circuit for a semiconductor element according to the present invention includes: a controller; a gate voltage detector; a gate current detector; a signal generation circuit; a first comparator; a second comparator; and a short circuit determination unit. The controller is configured to control open and closed states of the semiconductor element based on a command received from outside. The gate voltage detector is configured to detect a gate voltage of the semiconductor element and generate a voltage detection signal indicating the detected gate voltage. The gate current detector is configured to detect a current flowing into a gate electrode of the semiconductor element. The signal generation circuit is configured to generate, as an output signal, one of a first differential amplification signal of the voltage detection signal and a first delay signal of the voltage detection signal, a second differential amplification signal of the first delay signal and a second delay signal of the voltage detection signal, and a differentiation signal of the voltage detection signal. The first comparator is configured to compare a value of the output signal with a first reference value. The second comparator is configured to compare a current detection value by the gate current detector with a second reference value. The short circuit determination unit is configured to determine whether or not the semiconductor element is in a short-circuited state, based on a result of comparison by the first comparator and a result of comparison by the second comparator, and generate a determination signal indicating a determination result.

Advantageous Effects of Invention

According to the present invention, a sense cell of the semiconductor element is not required, application to a wide variety of semiconductor elements is possible, and a short-circuited state of the semiconductor element can be determined easily and at high speed.

BRIEF DESCRIPTION OF DRAWINGS

FIG. 4 is a schematic view showing a voltage detection signal Vg when the semiconductor element is turned on.

FIG. 5 is a schematic view showing a change over time in voltage value E indicating a gate current value Ig when a semiconductor element 1 is turned on.

DESCRIPTION OF EMBODIMENTS

Figure 1:
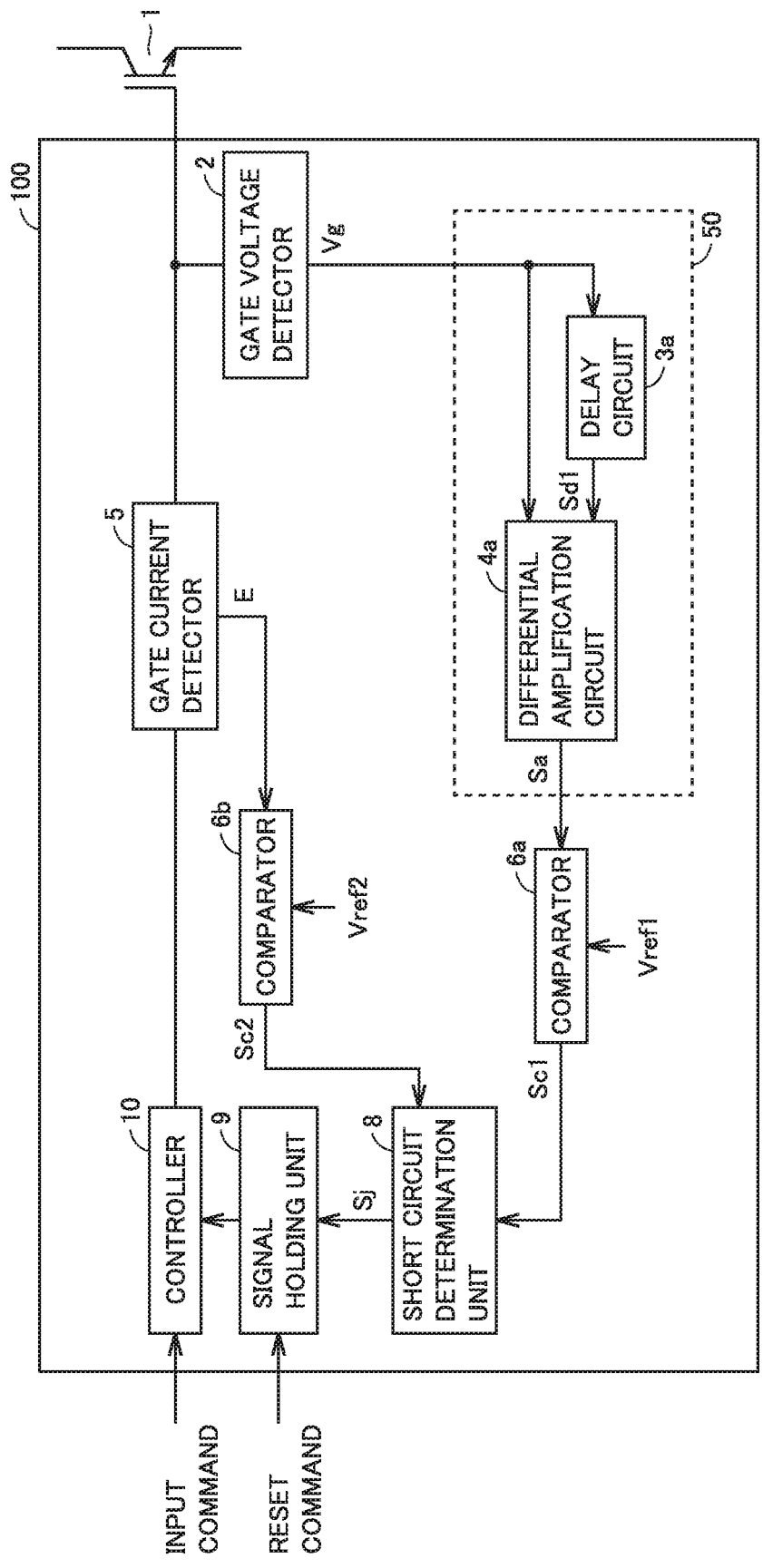
FIG. 1 shows a configuration of a drive circuit for a semiconductor element according to a first embodiment.

Embodiments of the present invention will be described in detail with reference to the drawings, in which the same or corresponding portions are denoted by the same reference characters and description thereof will not be repeated. The embodiments or modifications described below may be combined as appropriate.

First Embodiment

FIG. 1 shows a configuration of a drive circuit 100 for a semiconductor element 1 according to a first embodiment. Semiconductor element 1 is an IGBT and has a gate electrode connected to drive circuit 100. In the first embodiment, a collector electrode of semiconductor element 1 receives a positive voltage through a peripheral circuit, to form a positive electrode. An emitter electrode of semiconductor element 1 is connected to a ground, to form a negative electrode. Semiconductor element 1 may be another power semiconductor element such as a power MOSFET.

Drive circuit 100 is connected to the gate electrode of semiconductor element 1 and drives semiconductor element 1. Drive circuit 100 includes a gate voltage detector 2, a signal generation circuit 50, a gate current detector 5, comparators 6a and 6b, a short circuit determination unit 8, a signal holding unit 9, and a controller 10.

Controller 10 controls open and closed states of semiconductor element 1 based on an input command received from outside. When controller 10 receives an off command from outside, controller 10 outputs an off gate voltage for turning off semiconductor element 1 (bringing semiconductor element 1 into the open state) to the gate electrode of semiconductor element 1. When controller 10 receives an on command from outside, controller 10 outputs an on gate voltage for turning on semiconductor element 1 (bringing semiconductor element 1 into the closed state) to the gate electrode of semiconductor element 1.

Gate voltage detector 2 detects a gate voltage (voltage of the gate electrode) of semiconductor element 1, and generates a voltage detection signal Vg indicating the detected gate voltage. Voltage detection signal Vg is indicated by a change in voltage value. Gate voltage detector 2 may generate a value itself of the gate voltage of semiconductor element 1 as voltage detection signal Vg, or may generate a value of the gate voltage multiplied by a constant as voltage detection signal Vg. Gate voltage detector 2 outputs generated voltage detection signal Vg to signal generation circuit 50.

Signal generation circuit 50 generates and outputs an output signal related to the gate voltage of semiconductor element 1. In the present embodiment, signal generation circuit 50 generates, as the output signal, a differential amplification signal Sa of voltage detection signal Vg and a delay signal Sd1 of voltage detection signal Vg. Signal generation circuit 50 includes a delay circuit 3a and a differential amplification circuit 4a.

Delay circuit 3a receives voltage detection signal Vg and generates delay signal Sd1 of voltage detection signal Vg. Delay circuit 3a outputs generated delay signal Sd1 to differential amplification circuit 4a.

Figure 2:
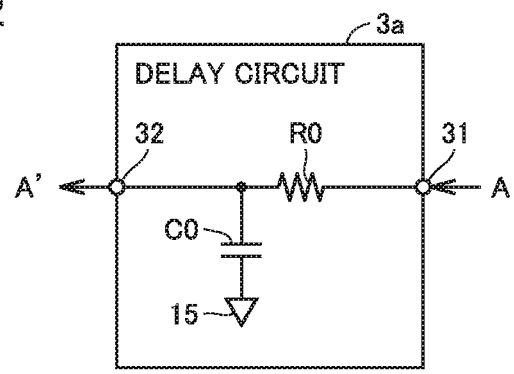
FIG. 2 shows an example configuration of a delay circuit.

FIG. 2 shows an example configuration of delay circuit 3a. As shown in FIG. 2, delay circuit 3a includes a resistor R0 and a capacitor C0, for example. Resistor R0 is connected between an input terminal 31 and an output terminal 32 of delay circuit 3a. One end of capacitor C0 is connected to a ground 15 and has the same potential as that of the emitter electrode that is the negative electrode of semiconductor element 1. The other end of capacitor C0 is connected to output terminal 32. The configuration shown in FIG. 2 is generally known as one type of filter. A delay signal A' output from output terminal 32 with respect to an input signal A received by input terminal 31 can be expressed by the following equation (1), where r0 represents a resistance value of resistor R0, c0 represents a capacitance value of capacitor C0, and t represents a time period from the time of reception of input signal A.

$$A' = A \times \exp\left(-\frac{t}{r0 \times c0}\right) \quad \text{equation (1)}$$

Delay circuit 3a is not limited to the configuration shown in FIG. 2 and may be formed of a plurality of resistors and a plurality of capacitors.

Returning to FIG. 1, differential amplification circuit 4a generates differential amplification signal Sa of voltage detection signal Vg generated by gate voltage detector 2 and delay signal Sd1 output from delay circuit 3a, and outputs generated differential amplification signal Sa to comparator 6a.

Figure 3:
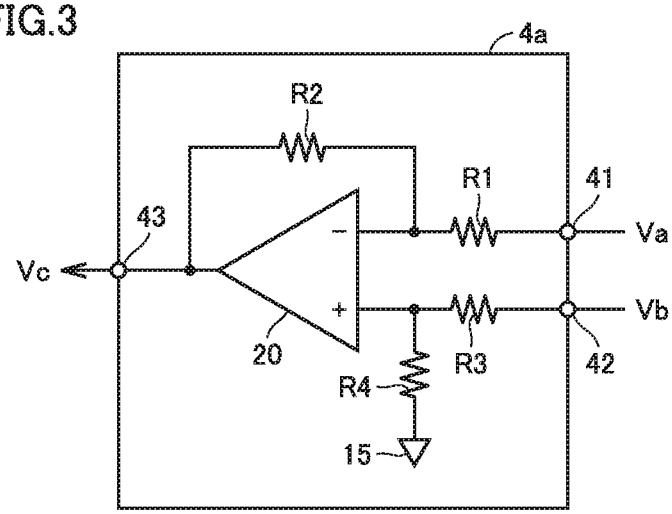
FIG. 3 shows an example configuration of a differential amplification circuit.

FIG. 3 shows an example configuration of differential amplification circuit 4a. As shown in FIG. 3, differential amplification circuit 4a includes resistors R1 to R4, an operational amplifier 20, input terminals 41 and 42, and an output terminal 43, for example.

Output terminal 43 is connected to an output terminal of operational amplifier 20. Resistor R1 is connected between an inverted input terminal of operational amplifier 20 and input terminal 41. Resistor R2 is connected between an inverted input terminal of operational amplifier 20 and output terminal 43. Resistor R3 is connected between a non-inverted input terminal of operational amplifier 20 and input terminal 42. Resistor R4 is connected between a non-inverted input terminal of operational amplifier 20 and ground 15. When Va represents a voltage value of input terminal 41 and Vb represents a voltage value of input terminal 42, a voltage value Vc of output terminal 43 is expressed by the following equation (2), where r1 to r4 represent resistance values of resistors R1 to R4, respectively.

$$Vc = \left(\frac{r1+r2}{r3+r4}\right)\frac{r4}{r1}Vb - \frac{r2}{r1}Va \qquad \text{equation (2)}$$

Furthermore, when resistor R1 has the same resistance value as that of resistor R3 and resistor R2 has the same resistance value as that of resistor R4, voltage value Vc of output terminal 43 is expressed by the following equation (3).

$$Vc = \frac{r2}{r1}(Vb - Va) \qquad \text{equation (3)}$$

By inputting delay signal Sd1 of voltage detection signal Vg to input terminal 41 and inputting voltage detection signal Vg to input terminal 42, differential amplification signal Sa can be obtained from output terminal 43. Differential amplification signal Sa is formed by subtracting delay signal Sd1 from voltage detection signal Vg to obtain a difference, and amplifying the difference.

Comparator 6a compares a value of differential amplification signal Sa generated by differential amplification circuit 4a with a first reference voltage value Vref1, and generates a signal Sc1 indicating a comparison result. When the value of differential amplification signal Sa is larger than first reference voltage value Vref1, comparator 6a generates high-level signal Sc1. When differential amplification signal Sa is not larger than first reference voltage value Vref1, comparator 6a generates low-level signal Sc1. Comparator 6a outputs generated signal Sc1 to short circuit determination unit 8.

Gate current detector 5 detects a current (gate current) flowing from controller 10 into the gate electrode of semiconductor element 1, and outputs a voltage (voltage value E (current detection value)) corresponding to detected gate current value Ig to comparator 6b. Voltage value E can be expressed as E=k×Ig using a proportionality factor k.

Comparator 6b compares voltage value E received from gate current detector 5 with a second reference voltage value Vref2, and generates a signal Sc2 corresponding to a comparison result. When voltage value E is smaller than second reference voltage value Vref2, comparator 6b generates high-level signal Sc2. When voltage value E is not smaller than second reference voltage value Vref2, comparator 6b generates low-level signal Sc2. Comparator 6b outputs generated signal Sc2 to short circuit determination unit 8.

Short circuit determination unit 8 performs an AND operation of signal Sc1 received from comparator 6a and signal Sc2 received from comparator 6b, to thereby determine whether or not semiconductor element 1 is in a short-circuited state. "Short-circuited state" herein refers to a state in which semiconductor element 1 is connected to a voltage source in a low resistance state and an excessive short circuit current flows due to factors such as failure and malfunction of a peripheral component of semiconductor element 1. When signal Sc1 received from comparator 6a is high-level and signal Sc2 received from comparator 6b is high-level, short circuit determination unit 8 determines that semiconductor element 1 is in the short-circuited state, and outputs a high-level determination signal Sj. Otherwise, short circuit determination unit 8 outputs low-level determination signal Sj. In other words, when the value of differential amplification signal Sa received from differential amplification circuit 4a is larger than first reference voltage value Vref1 and voltage value E received from gate current detector 5 is smaller than second reference voltage value Vref2, short circuit determination unit 8 determines that semiconductor element 1 is in the short-circuited state.

When short circuit determination unit 8 determines that semiconductor element 1 is in the short-circuited state, signal holding unit 9 holds high-level determination signal Sj. Specifically, when signal holding unit 9 receives, from short circuit determination unit 8, low-level determination signal Sj indicating that semiconductor element 1 is not in the short-circuited state, signal holding unit 9 outputs determination signal Sj itself to controller 10. When signal holding unit 9 receives, from short circuit determination unit 8, high-level determination signal Sj indicating that semiconductor element 1 is in the short-circuited state, signal holding unit 9 holds high-level determination signal Sj and outputs high-level determination signal Sj to controller 10, until a reset command is received from outside. When the reset command is received from outside while signal holding unit 9 is holding high-level determination signal Sj, signal holding unit 9 stops holding high-level determination signal Sj and outputs determination signal Sj itself received from short circuit determination unit 8 to controller 10.

While controller 10 is receiving low-level determination signal Sj from signal holding unit 9, controller 10 controls the open and closed states of semiconductor element 1 in accordance with the input command from outside. Controller 10 outputs the off gate voltage to the gate electrode of semiconductor element 1 in order to maintain semiconductor element 1 in the off state (open state) regardless of the input command from outside while controller 10 is receiving high-level determination signal Sj from signal holding unit 9.

Figure 4:
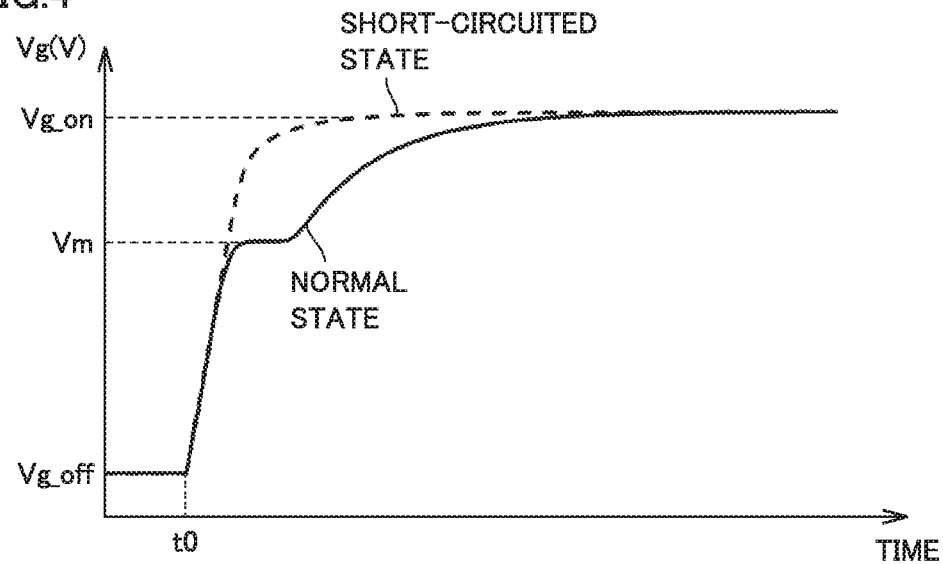
Figure 5:
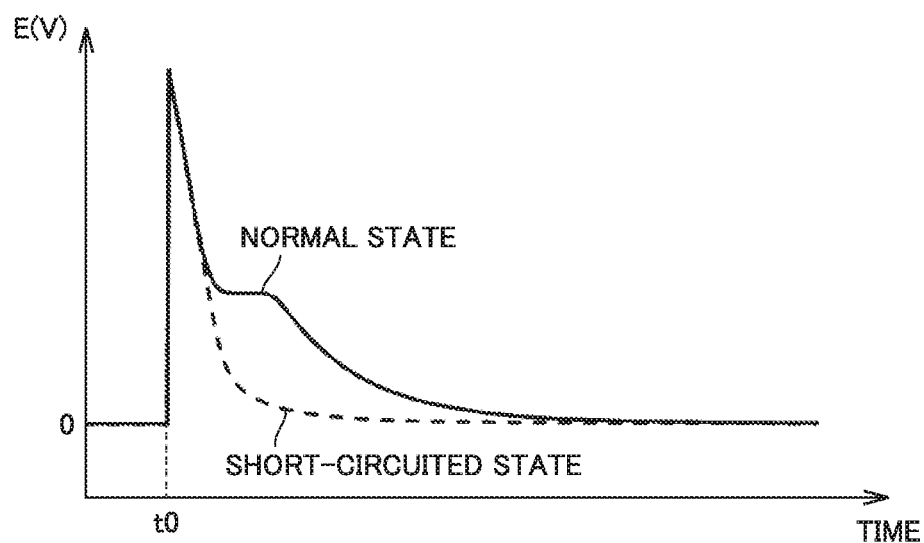

FIG. 4 is a schematic view showing voltage detection signal Vg when semiconductor element 1 is turned on. FIG. 5 is a schematic view showing a change over time in voltage value E indicating gate current value Ig when semiconductor element 1 is turned on. In each of FIGS. 4 and 5, a waveform in a normal state is indicated by a solid line, and a waveform when there is a short-circuited state (hereinafter, referred to as "in the short-circuited state") is indicated by a broken line.

First, voltage detection signal Vg and voltage value E in the normal state will be described. At time t0 when the input command from outside to controller 10 changes from the off command to the on command, voltage detection signal Vg starts transition from an off gate voltage Vg_off to an on gate voltage Vg_on. At this time, the gate current flows from controller 10 into the gate electrode of semiconductor element 1. When semiconductor element 1 operates normally, a period during which the gate voltage is constant appears during transition from off gate voltage Vg_off to on gate voltage Vg_on. Generally, this period is called "mirror period" and the gate voltage during the mirror period is called "mirror voltage Vm". This is a period for charging a capacitance present between the gate electrode of semiconductor element 1 and the collector electrode that is the positive electrode of semiconductor element 1. Generally, the capacitance present between the gate electrode and the collector electrode that is the positive electrode is called "feedback capacitance". When semiconductor element 1 operates normally, the gate electrode is higher in potential than the collector electrode of semiconductor element 1, and thus, the substantially constant gate current for charging the feedback capacitance flows from the gate electrode to the collector electrode of semiconductor element 1 during the mirror period. The length of the mirror period and mirror voltage Vm change depending on operation conditions such as a voltage between the positive electrode (herein, collector electrode) and the negative electrode (herein, emitter electrode) of semiconductor element 1 and a conduction current. When charging of the feedback capacitance ends, voltage detection signal Vg rises again and reaches on gate voltage Vg_on controlled by controller 10. When voltage detection signal Vg reaches on gate voltage Vg_on (i.e., when transition to the on state is completed), voltage value E indicating gate current value Ig converges to zero.

Next, voltage detection signal Vg and voltage value E in the short-circuited state will be described. At time t0 when the input command from outside to controller 10 changes from the off command to the on command, voltage detection signal Vg starts transition from off gate voltage Vg_off to on gate voltage Vg_on. At this time, the gate current flows from controller 10 into the gate electrode of semiconductor element 1. When semiconductor element 1 is in the short-circuited state, voltage detection signal Vg reaches on gate voltage Vg_on controlled by controller 10, without the mirror period. In the short-circuited state, a peripheral circuit connected to the positive electrode (herein, collector electrode) of semiconductor element 1 is short-circuited, and thus, a large voltage is applied between the positive electrode (herein, collector electrode) and the negative electrode (herein, emitter electrode) of semiconductor element 1. As a result, the potential of the collector electrode of semiconductor element 1 becomes higher than the potential of the gate electrode and the feedback capacitance is not charged, and thus, the mirror period does not appear. Therefore, the gate current for charging the feedback capacitance does not flow, and voltage value E indicating gate current value Ig rises immediately after time t0 and then converges to zero earlier than in the normal state.

Figure 6:
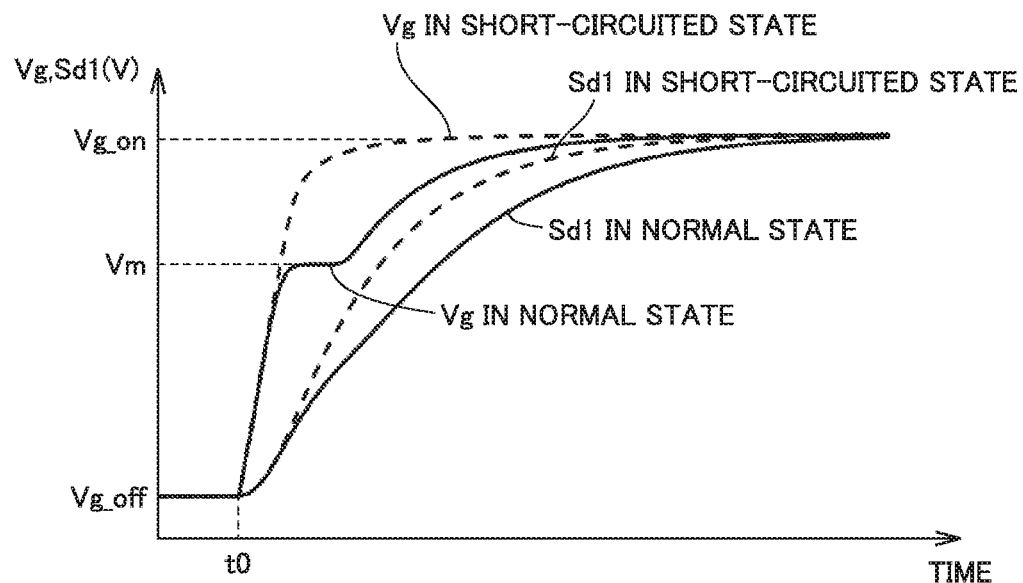
FIG. 6 is a schematic view showing voltage detection signal Vg generated by a gate voltage detector and a delay signal Sd1 generated by the delay circuit.
Figure 7:
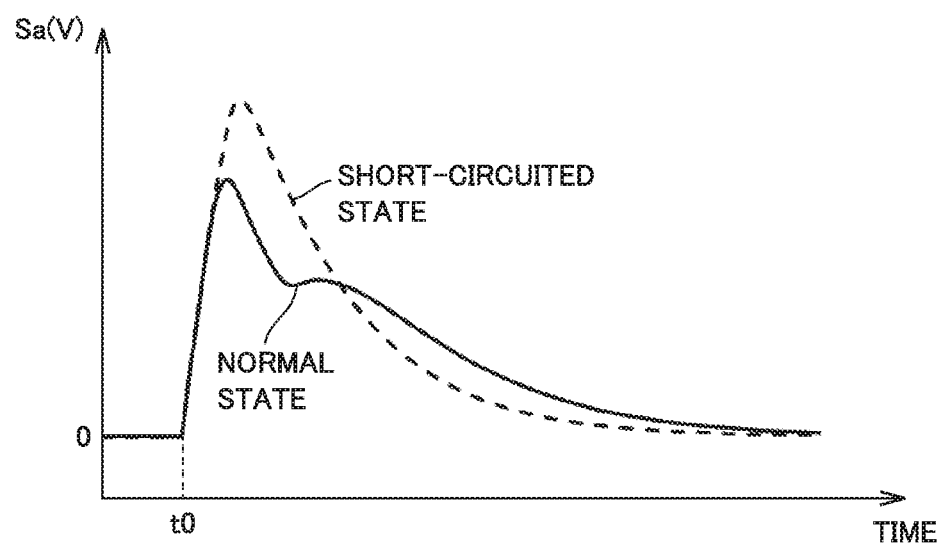
FIG. 7 is a schematic view showing a differential amplification signal Sa generated by the differential amplification circuit.

FIG. 6 is a schematic view showing voltage detection signal Vg generated by gate voltage detector 2 and delay signal Sd1 generated by delay circuit 3a. FIG. 7 is a schematic view showing differential amplification signal Sa generated by differential amplification circuit 4a. In each of FIGS. 6 and 7, a waveform in the normal state is indicated by a solid line, and a waveform in the short-circuited state is indicated by a broken line. The waveforms shown in FIGS. 6 and 7 are waveforms when delay circuit 3a is configured as shown in FIG. 2, differential amplification circuit 4a is configured as shown in FIG. 3, delay signal Sd1 is input to input terminal 41 of differential amplification circuit 4a, and voltage detection signal Vg is input to input terminal 42 of differential amplification circuit 4a.

As shown in FIGS. 6 and 7, in the short-circuited state, the mirror period does not appear, and thus, voltage detection signal Vg rises monotonously and a difference between voltage detection signal Vg and delay signal Sd1 is large. In contrast, in the normal state, a rise in voltage detection signal Vg is restricted by the mirror period. Therefore, a difference between voltage detection signal Vg and delay signal Sd1 in the normal state is smaller than the difference between voltage detection signal Vg and delay signal Sd1 in the short-circuited state. As a result, a maximum value of a value that may be taken by differential amplification signal Sa in the short-circuited state is larger than a maximum value of a value that may be taken by differential amplification signal Sa in the normal state. Furthermore, voltage detection signal Vg and delay signal Sd1 in the short-circuited state reach on gate voltage Vg_on controlled by controller 10 earlier than in the normal state.

Figure 8:
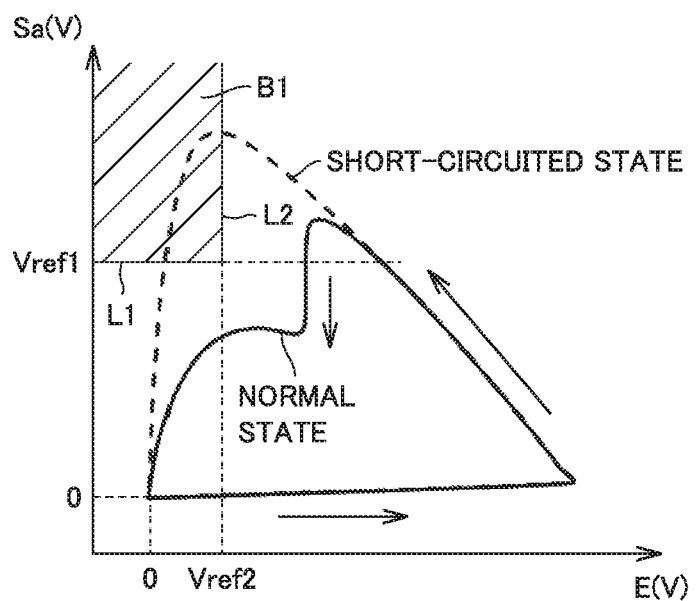
FIG. 8 shows transition over time of voltage value E and a value of differential amplification signal Sa at each time during a period from time t0 of reception of an on command to a time of convergence of differential amplification signal Sa to zero.

FIG. 8 shows transition over time of voltage value E and the value of differential amplification signal Sa during a period from time t0 of reception of the on command to a time of convergence of differential amplification signal Sa to zero. In FIG. 8, the horizontal axis represents voltage value E and the vertical axis represents the value of differential amplification signal Sa. FIG. 8 shows a graph in which voltage value E and the value of differential amplification signal Sa at each time during the period from time t0 to the time of convergence of differential amplification signal Sa to zero are plotted. In FIG. 8, transition over time of the plot in the normal state is indicated by a solid line, and transition over time of the plot in the short-circuited state is indicated by a broken line.

As shown in FIG. 8, a difference is produced between the transition over time of the plot in the normal state and the transition over time of the plot in the short-circuited state, in accordance with the presence or absence of the mirror period. Specifically, the broken line obtained from the transition over time of the plot in the short-circuited state protrudes in an upper left direction from the solid line obtained from the transition over time of the plot in the normal state. Now, a coordinate value of the vertical axis is first reference voltage value Vref1 and a straight line parallel to the horizontal axis is a first straight line L1. Furthermore, a coordinate value of the horizontal axis is second reference voltage value Vref2 and a straight line parallel to the vertical axis is a second straight line L2. At this time, the plot in the short-circuited state is present and the plot in the normal state is not present in an upper left divided region B1, of four regions on a coordinate plane divided by first straight line L1 and second straight line L2. Therefore, when the value of differential amplification signal Sa is larger than first reference voltage value Vref1 and voltage value E indicating gate current value Ig is smaller than second reference voltage value Vref2, short circuit determination unit 8 can easily determine that semiconductor element 1 is in the short-circuited state.

Furthermore, the mirror period does not appear in the short-circuited state, and thus, voltage value E temporarily rises, and then, converges to zero immediately. Therefore, it is determined at high speed by short circuit determination unit 8 that semiconductor element 1 is in the short-circuited state, and semiconductor element 1 is controlled to the open state at high speed by controller 10. As a result, semiconductor element 1 can be protected at high speed.

As described above, drive circuit 100 according to the first embodiment includes controller 10, gate voltage detector 2, gate current detector 5, signal generation circuit 50, comparator (first comparator) 6a, comparator (second comparator) 6b, and short circuit determination unit 8. Signal generation circuit 50 generates, as the output signal, differential amplification signal (first differential amplification signal) Sa of voltage detection signal Vg and delay signal (first delay signal) Sd1 of voltage detection signal Vg. Comparator 6a compares the value of differential amplification signal Sa with first reference voltage value (first reference value) Vref1. Comparator 6b compares voltage value (current detection value) E generated by gate current detector 5 with second reference voltage value (second reference value) Vref2. Short circuit determination unit 8 determines whether or not semiconductor element 1 is in the short-circuited state, based on the result of comparison by each of comparators 6a and 6b, and generates determination signal Sj indicating the determination result.

As described above, it can be determined whether or not semiconductor element 1 is in the short-circuited state, based on the result of comparison between the value of differential amplification signal Sa and first reference voltage value Vref1 as well as the result of comparison between voltage value E received from gate current detector 5 and second reference voltage value Vref2. Therefore, drive circuit 100 is also applicable to a semiconductor element that is not provided with a sense cell and a shunt resistor. Furthermore, it is unnecessary to set the short circuit detection period as in the technique described in Japanese Patent Laying-Open No. 2009-225506, and thus, the short-circuited state of semiconductor element 1 can be easily determined. Furthermore, when semiconductor element 1 is short-circuited, the mirror period does not appear at the time of turning on semiconductor element 1. Therefore, a state in which the value of differential amplification signal Sa is larger than first reference voltage value Vref1 and voltage value E is smaller than second reference voltage value Vref2 appears immediately. Therefore, the short-circuited state of semiconductor element 1 can be determined at high speed. Based on the foregoing, drive circuit 100 does not require a sense cell of the semiconductor element, is applicable to a wide variety of semiconductor elements, and can determine the short-circuited state of semiconductor element 1 easily and at high speed.

Signal generation circuit 50 includes delay circuit (first delay circuit) 3a configured to receive voltage detection signal Vg and generate delay signal Sd1, and differential amplification circuit (first differential amplification circuit) 4a configured to receive voltage detection signal Vg and delay signal Sd1 and generate differential amplification signal Sa. As a result, signal generation circuit 50 can easily generate differential amplification signal Sa.

Drive circuit 100 further includes signal holding unit 9 configured to hold determination signal Sj when short circuit determination unit 8 determines that semiconductor element 1 is in the short-circuited state. As a result, even when the plot point of voltage value E and the value of differential amplification signal Sa moves from inside divided region B1 shown in FIG. 8 to outside divided region B1, determination signal Sj indicating that semiconductor element 1 is in the short-circuited state is held. As a result, drive circuit 100 can more reliably determine the short-circuited state of semiconductor element 1.

Furthermore, controller 10 is configured to turn off semiconductor element 1 (bring semiconductor element 1 into the open state) when determination signal Sj indicates that semiconductor element 1 is in the short-circuited state. As a result, when semiconductor element 1 is in the short-circuited state, semiconductor element 1 can be protected.

Second Embodiment

Figure 9:
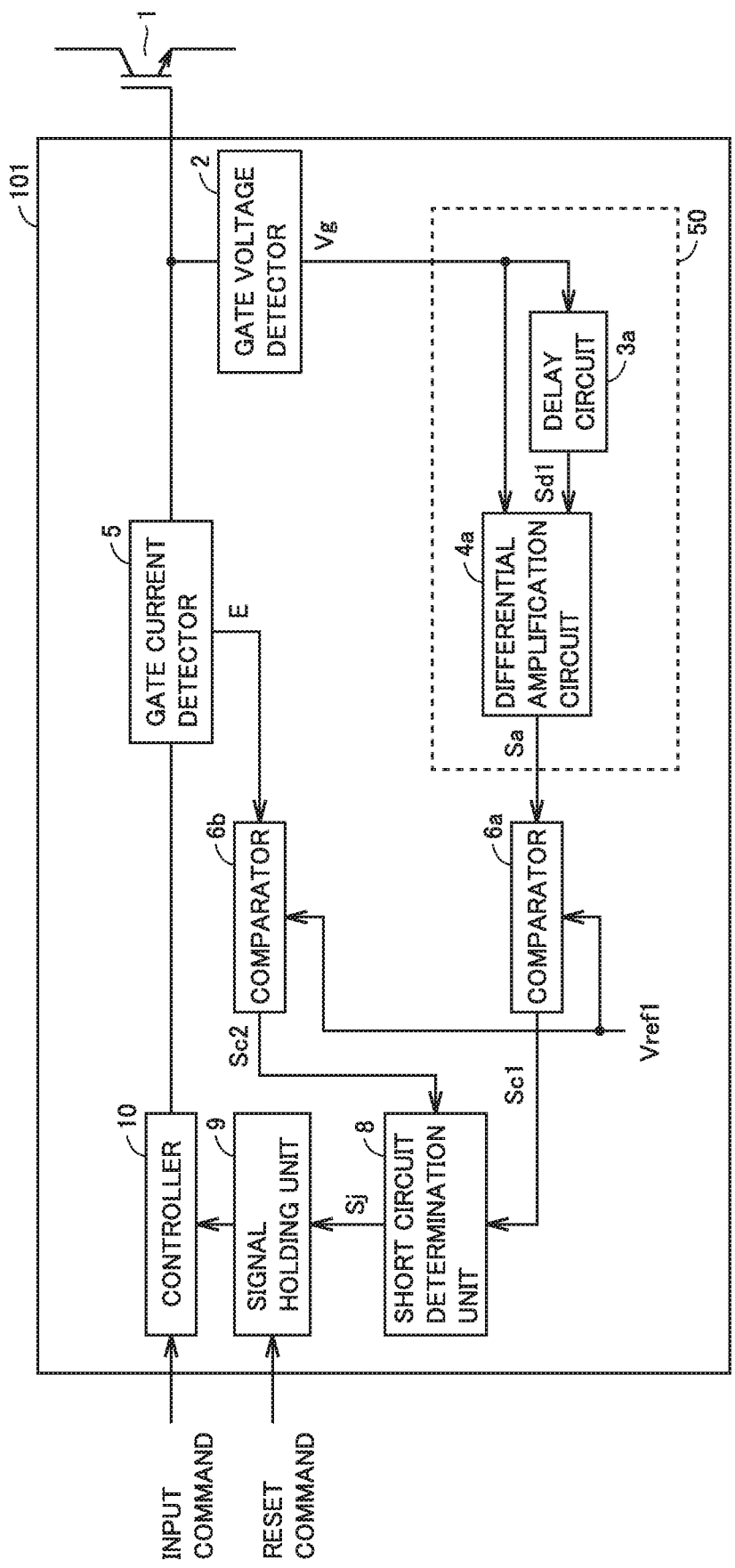
FIG. 9 shows a configuration of a drive circuit according to a second embodiment.

A drive circuit for a semiconductor element according to a second embodiment will be described with reference to FIG. 9. FIG. 9 shows a configuration of a drive circuit 101 according to the second embodiment. As shown in FIG. 9, drive circuit 101 is different from drive circuit 100 according to the first embodiment in that a voltage of first reference voltage value Vref1 is input to both comparators 6a and 6b.

In the second embodiment, second reference voltage value Vref1 used in comparator 6b is identical to first reference voltage value Vref1 used in comparator 6a. That is, the common reference voltage is input to comparator 6a and comparator 6b. Thus, a circuit size of drive circuit 101 can be reduced. As a result, drive circuit 101 lower in cost and smaller in size than that of the first embodiment can be achieved.

As described above, gate current detector 5 outputs voltage value E obtained by multiplying gate current value Ig by proportionality factor k. Therefore, by adjusting proportionality factor k, a level of voltage value E can be changed. In addition, by adjusting an amplification factor of differential amplification circuit 4a or the delay time of delay circuit 3a, an amplitude of differential amplification signal Sa output from differential amplification circuit 4a can be changed. By adjusting at least one of proportionality factor k, the amplification factor of differential amplification circuit 4a and the delay time of delay circuit 3a as appropriate, it can be determined whether or not semiconductor element 1 is in the short-circuited state, even when the common voltage of first reference voltage value Vref1 is input to comparators 6a and 6b.

Third Embodiment

Figure 10:
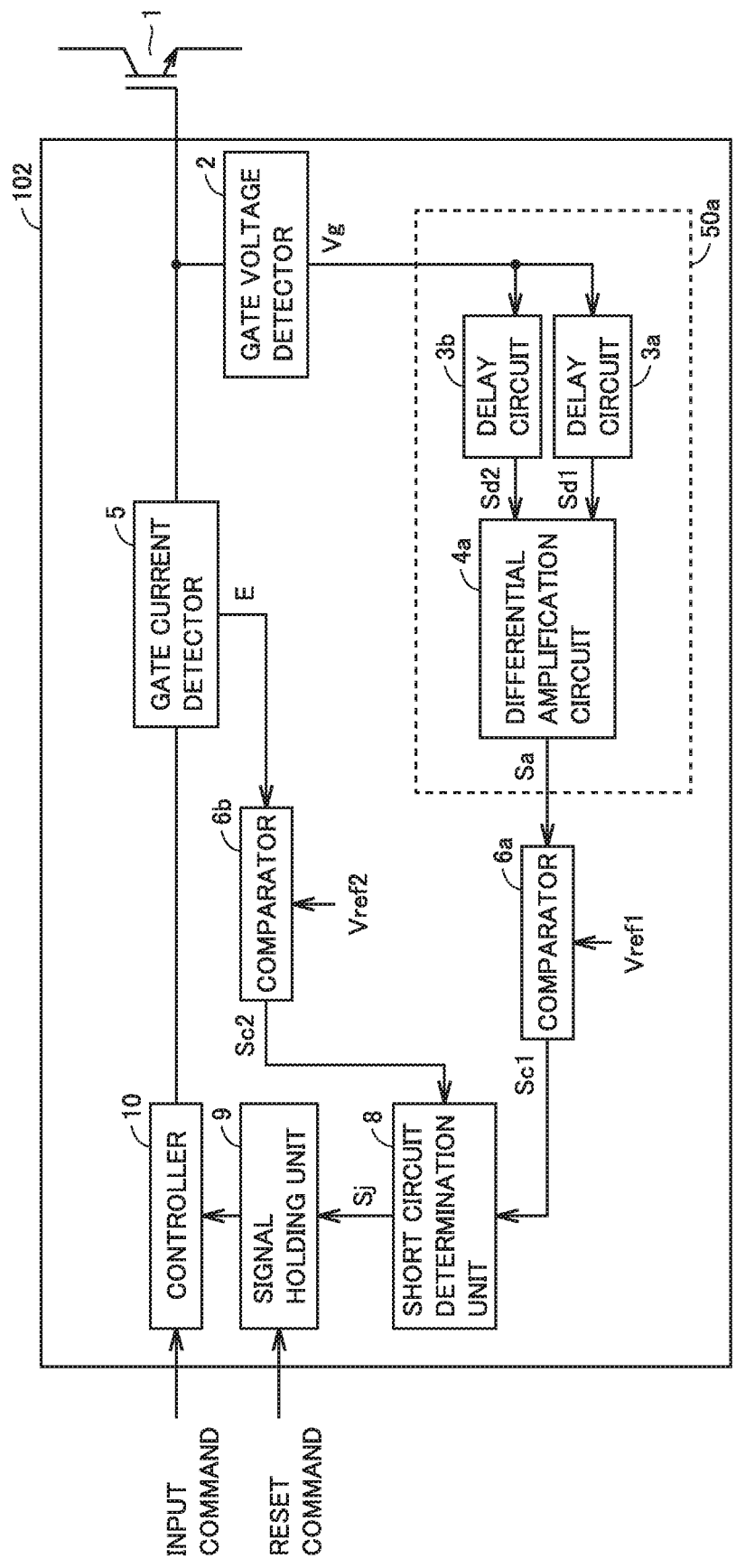
FIG. 10 shows a configuration of a drive circuit according to a third embodiment.

A drive circuit for a semiconductor element according to a third embodiment will be described with reference to FIG. 10. FIG. 10 shows a configuration of a drive circuit 102 according to the third embodiment. As shown in FIG. 10, drive circuit 102 is different from drive circuit 100 (see FIG. 1) according to the first embodiment in that drive circuit 102 includes a signal generation circuit 50a instead of signal generation circuit 50. Signal generation circuit 50a is different from signal generation circuit 50 in the first embodiment in that signal generation circuit 50a further includes a delay circuit 3b.

Delay circuit 3b receives voltage detection signal Vg output from gate voltage detector 2, and generates a delay signal (second delay signal) Sd2 that is delayed voltage detection signal Vg. The delay time in delay circuit 3b is different from the delay time in delay circuit 3a.

Differential amplification circuit 4a generates differential amplification signal Sa obtained by amplifying a difference between delay signal Sd1 generated by delay circuit 3a and delay signal Sd2 generated by delay circuit 3b.

According to the third embodiment, by setting the delay times of delay circuits 3a and 3b as appropriate, the noise resistance can be improved and the amplitude of differential amplification signal Sa can be adjusted. As a result, it can be more easily determined whether or not semiconductor element 1 is in the short-circuited state. Another delay circuit may be added between differential amplification circuit 4a and comparator 6a.

Fourth Embodiment

Figure 11:
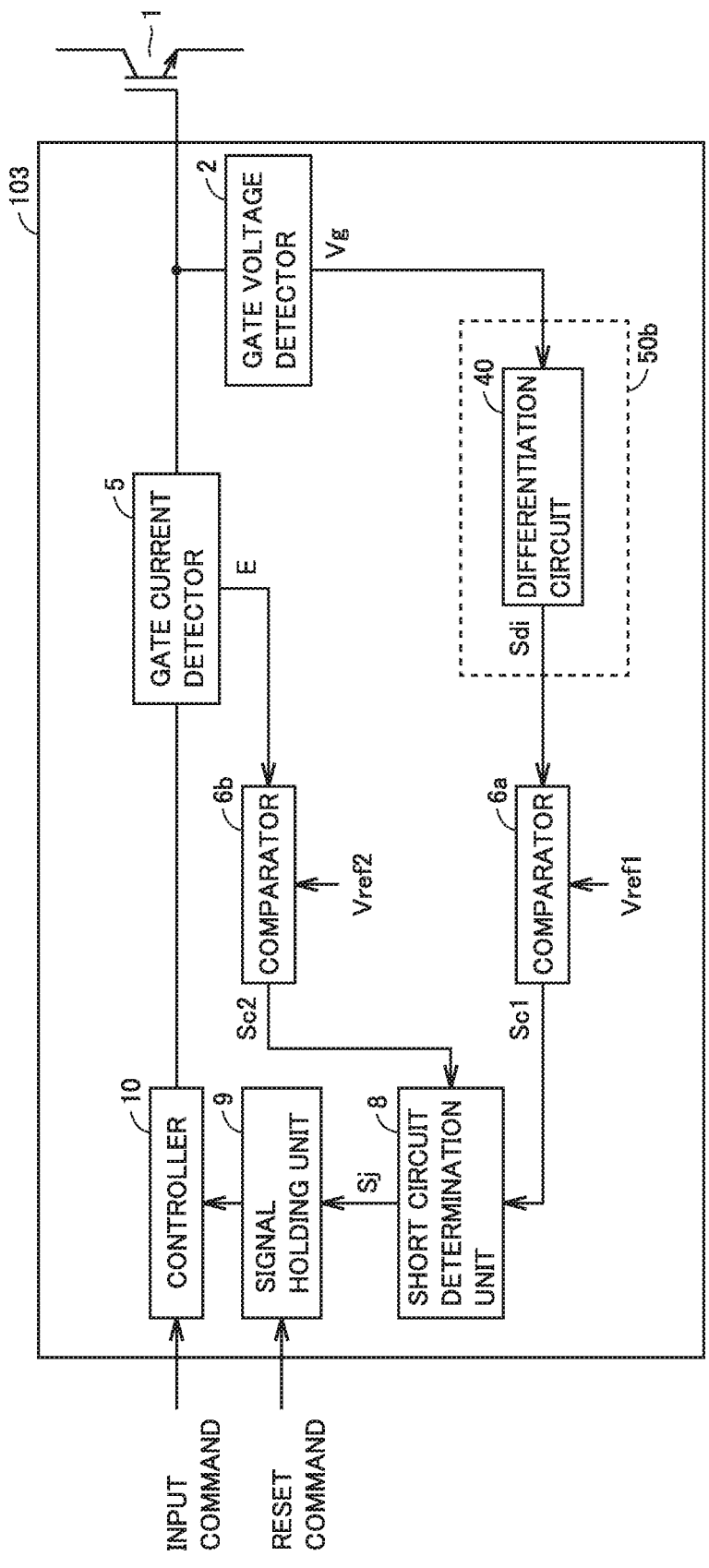
FIG. 11 shows a configuration of a drive circuit according to a fourth embodiment.

A drive circuit for a semiconductor element according to a fourth embodiment will be described with reference to FIG. 11. FIG. 11 shows a configuration of a drive circuit 103 according to the fourth embodiment. As shown in FIG. 11, drive circuit 103 is different from drive circuit 100 (see FIG. 1) according to the first embodiment in that drive circuit 103 includes a signal generation circuit 50b instead of signal generation circuit 50. Signal generation circuit 50b is different from signal generation circuit 50 in the first embodiment in that signal generation circuit 50b includes a differentiation circuit 40 instead of delay circuit 3a and differential amplification circuit 4a.

Differentiation circuit 40 receives voltage detection signal Vg from gate voltage detector 2, and generates a differentiation signal Sdi of voltage detection signal Vg. Differentiation circuit 40 outputs generated differentiation signal Sdi to comparator 6a.

Instead of differential amplification signal Sa, comparator 6a compares a value of differentiation signal Sdi with first reference voltage value Vref1. When the value of differentiation signal Sdi is larger than first reference voltage value Vref1, comparator 6a outputs high-level signal Sc1. When the value of differentiation signal Sdi is not larger than first reference voltage value Vref1, comparator 6a outputs low-level signal Sc1.

Figure 12:
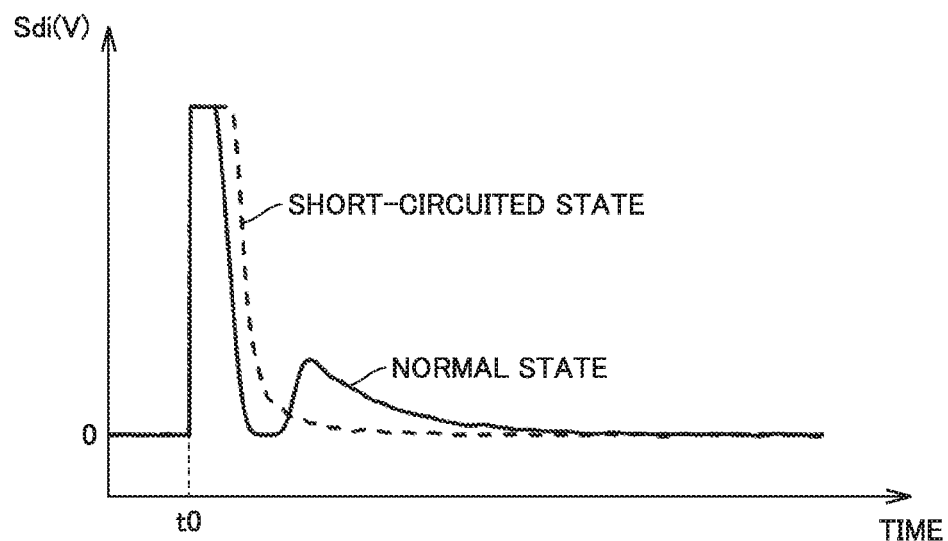
FIG. 12 shows a differentiation signal Sdi with respect to voltage detection signal Vg shown in FIG. 4.

FIG. 12 shows differentiation signal Sdi with respect to voltage detection signal Vg shown in FIG. 4. In FIG. 12, a waveform in the normal state is indicated by a solid line, and a waveform in the short-circuited state is indicated by a broken line. As shown in FIG. 4, voltage detection signal Vg in the short-circuited state increases monotonously after time t0 of reception of the on command, and reaches on gate voltage Vg_on. Therefore, as shown in FIG. 12, differentiation signal Sdi of voltage detection signal Vg in the short-circuited state is maintained at a fixed value from right after time t0, and then, converges to zero.

In contrast, the mirror period appears in voltage detection signal Vg in the normal state (see FIG. 4). Therefore, differentiation signal Sdi of voltage detection signal Vg in the normal state is maintained at a fixed value from time t0 to the start of the mirror period, and then, temporarily reaches zero during the mirror period. After the end of the mirror period, differentiation signal Sdi rises again, and then, converges to zero.

Figure 13:
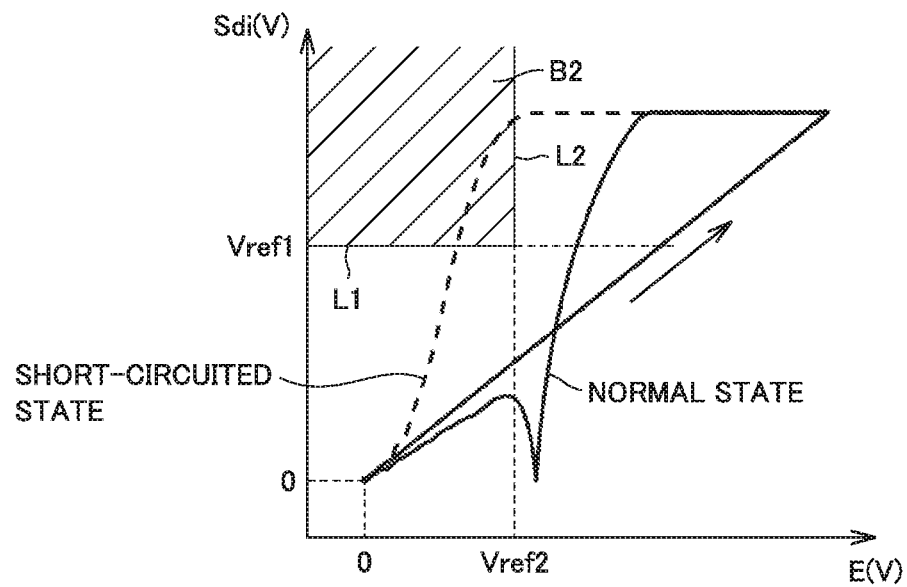
FIG. 13 shows transition over time of voltage value E and a value of differentiation signal Sdi during a period from time t0 of reception of an on command to a time of convergence of differentiation signal Sdi to zero.

FIG. 13 shows transition over time of voltage value E and the value of differentiation signal Sdi during a period from time t0 of reception of the on command to a time of convergence of differentiation signal Sdi to zero. In FIG. 13, the horizontal axis represents voltage value E and the vertical axis represents the value of differentiation signal Sdi. FIG. 13 shows a graph in which voltage value E and the value of differentiation signal Sdi at each time during the period from time t0 to the time of convergence of differential amplification signal Sa to zero are plotted. In FIG. 13, transition over time of the plot in the normal state is indicated by a solid line, and transition over time of the plot in the short-circuited state is indicated by a broken line.

As shown in FIG. 13, a difference is produced between the transition over time of the plot in the normal state and the transition over time of the plot in the short-circuited state, in accordance with the presence or absence of the mirror period. Specifically, the broken line obtained from the transition over time of the plot in the short-circuited state protrudes in an upper left direction from the solid line obtained from the transition over time of the plot in the normal state. Now, a coordinate value of the vertical axis is first reference voltage value Vref1 and a straight line parallel to the horizontal axis is a first straight line L1. Furthermore, a coordinate value of the horizontal axis is second reference voltage value Vref2 and a straight line parallel to the vertical axis is a second straight line L2. At this time, the plot in the short-circuited state is present and the plot in the normal state is not present in an upper left divided region B2, of four regions on a coordinate plane divided by first straight line L1 and second straight line L2. Therefore, when the value of differentiation signal Sdi is larger than first reference voltage value Vref1 and voltage value E indicating gate current value Ig is smaller than second reference voltage value Vref2, short circuit determination unit 8 can easily determine that semiconductor element 1 is in the short-circuited state.

Fifth Embodiment

Figure 14:
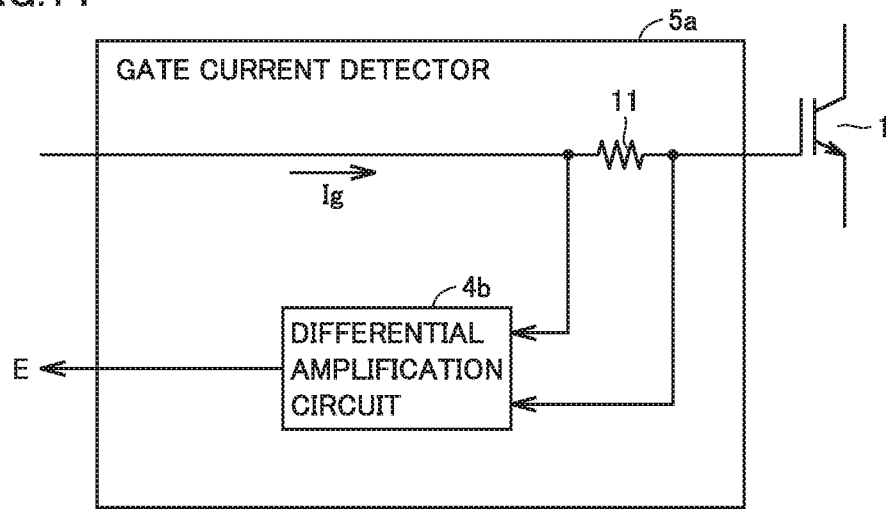
FIG. 14 is a circuit diagram showing a configuration of a gate current detector in a fifth embodiment.

A drive circuit according to a fifth embodiment is different from drive circuit 100 according to the first embodiment in that the drive circuit according to the fifth embodiment includes a gate current detector 5a shown in FIG. 14 instead of gate current detector 5. FIG. 14 is a circuit diagram showing a configuration of gate current detector 5a in the fifth embodiment.

As shown in FIG. 14, gate current detector 5a includes a gate resistor 11 connected between controller 10 and the gate electrode of semiconductor element 1, and a differential amplification circuit (second differential amplification circuit) 4b.

Differential amplification circuit 4b receives a voltage across gate resistor 11, and generates a differential amplification signal obtained by amplifying the voltage. Differential amplification circuit 4b outputs the generated differential amplification signal to comparator 6b. When Ig represents a gate current value flowing into semiconductor element 1, Rg_on represents a resistance value of gate resistor 11, and h represents an amplification factor of differential amplification circuit 4b, a value of the differential amplification signal generated by differential amplification circuit 4b is Rg_on×h×Ig. That is, the value of the differential amplification signal generated by differential amplification circuit 4b can be used as voltage value (current detection value) E indicating gate current value Ig.

As described above, according to the fifth embodiment, the value of the differential amplification signal (third differential amplification signal) generated by differential amplification circuit 4b can be used as voltage value E indicating gate current value Ig flowing from controller 10 into the gate electrode of semiconductor element 1.

Sixth Embodiment

Figure 15:
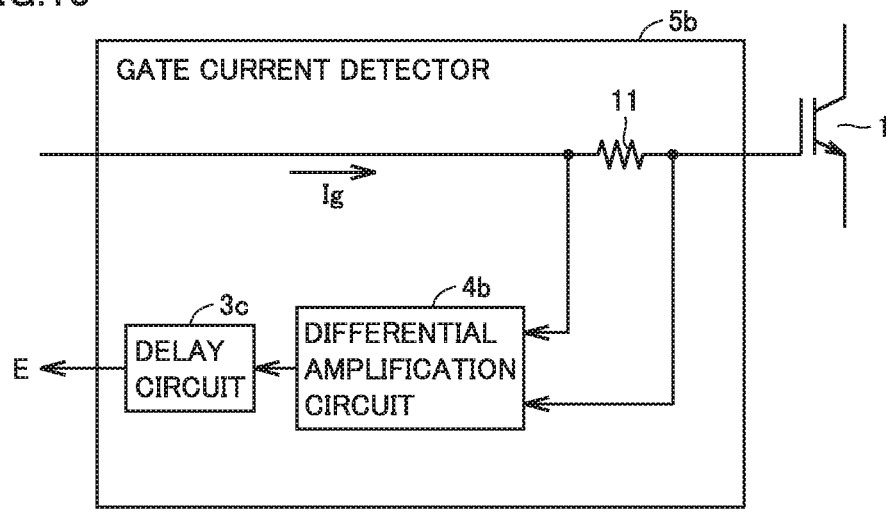
FIG. 15 is a circuit diagram showing a configuration of a gate current detector in a sixth embodiment.

A drive circuit according to a sixth embodiment is different from the drive circuit according to the fifth embodiment in that the drive circuit according to the sixth embodiment includes a gate current detector 5b shown in FIG. 15 instead of gate current detector 5a. FIG. 15 is a circuit diagram showing a configuration of gate current detector 5b in the sixth embodiment. As shown in FIG. 15, gate current detector 5b is different from gate current detector 5a shown in FIG. 14 in that gate current detector 5b further includes a delay circuit (third delay circuit) 3c.

Delay circuit 3c receives a differential amplification signal (third differential amplification signal) generated by differential amplification circuit 4b, and generates a delay signal (third delay signal) that is the delayed differential amplification signal. Delay circuit 3c outputs the generated delay signal to comparator 6b. As described above, the value of the differential amplification signal generated by differential amplification circuit 4b indicates gate current value Ig. Therefore, a value of the delay signal that is mere the delayed differential amplification signal can be used as voltage value E indicating gate current value Ig.

As described above, according to the sixth embodiment, the value of the delay signal generated by delay circuit 3c can be used as voltage value (current detection value) E indicating gate current value Ig. As a result, an influence of noise can be reduced, and adjustment of voltage value E in accordance with second reference voltage value Vref2 becomes easy in order to make it easy to determine whether or not semiconductor element 1 is in the short-circuited state.

Seventh Embodiment

Figure 16:
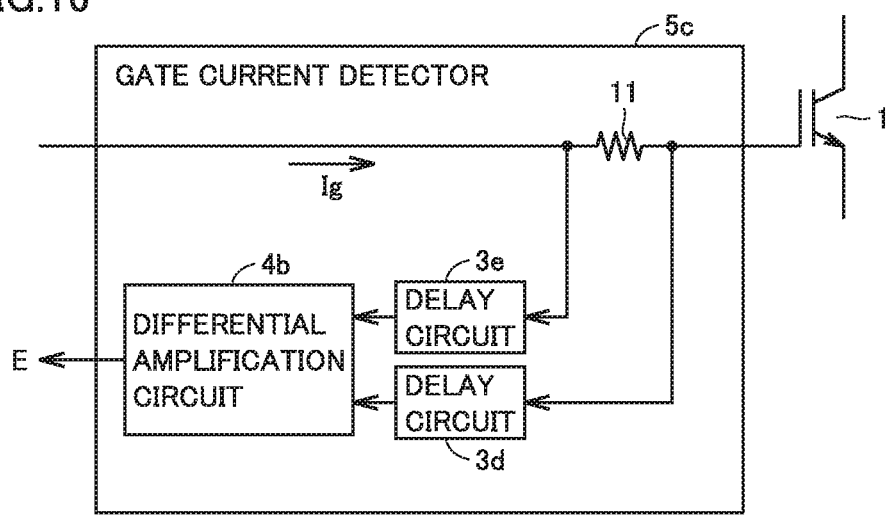
FIG. 16 is a circuit diagram showing a configuration of a gate current detector in a seventh embodiment.

A drive circuit according to a seventh embodiment is different from the drive circuit according to the fifth embodiment in that the drive circuit according to the seventh embodiment includes a gate current detector 5c shown in FIG. 16 instead of gate current detector 5a. FIG. 16 is a circuit diagram showing a configuration of gate current detector 5c in the seventh embodiment. As shown in FIG. 16, gate current detector 5c is different from gate current detector 5a in that gate current detector 5c further includes delay circuits 3d and 3e.

Delay circuit (fourth delay circuit) 3d receives a voltage signal of one end of gate resistor 11 on the semiconductor element 1 side, and generates a delay signal (fourth delay signal) that is the delayed voltage signal. Delay circuit (fifth delay circuit) 3e receives a voltage signal of the other end of gate resistor 11 on the controller 10 side, and generates a delay signal (fifth delay signal) that is the delayed voltage signal.

Differential amplification circuit (second differential amplification circuit) 4b receives the delay signal generated by delay circuit 3d and the delay signal generated by delay circuit 3e, and generates a differential amplification signal (third differential amplification signal) obtained by amplifying a difference between these delay signals. The difference between the delay signal generated by delay circuit 3d and the delay signal generated by delay circuit 3e correlates to the voltage across gate resistor 11, i.e., gate current value Ig. Therefore, a value of the differential amplification signal generated by differential amplification circuit 4b can be used as voltage value (current detection value) E indicating gate current value Ig.

According to the seventh embodiment, by including delay circuits 3d and 3e, an influence of noise can be further reduced, and adjustment of voltage value E in accordance with second reference voltage value Vref2 becomes easy in order to make it easy to determine whether or not semiconductor element 1 is in the short-circuited state.

Similarly to the sixth embodiment, delay circuit 3c may be connected to a stage subsequent to differential amplification circuit 4b.

Figure 17:
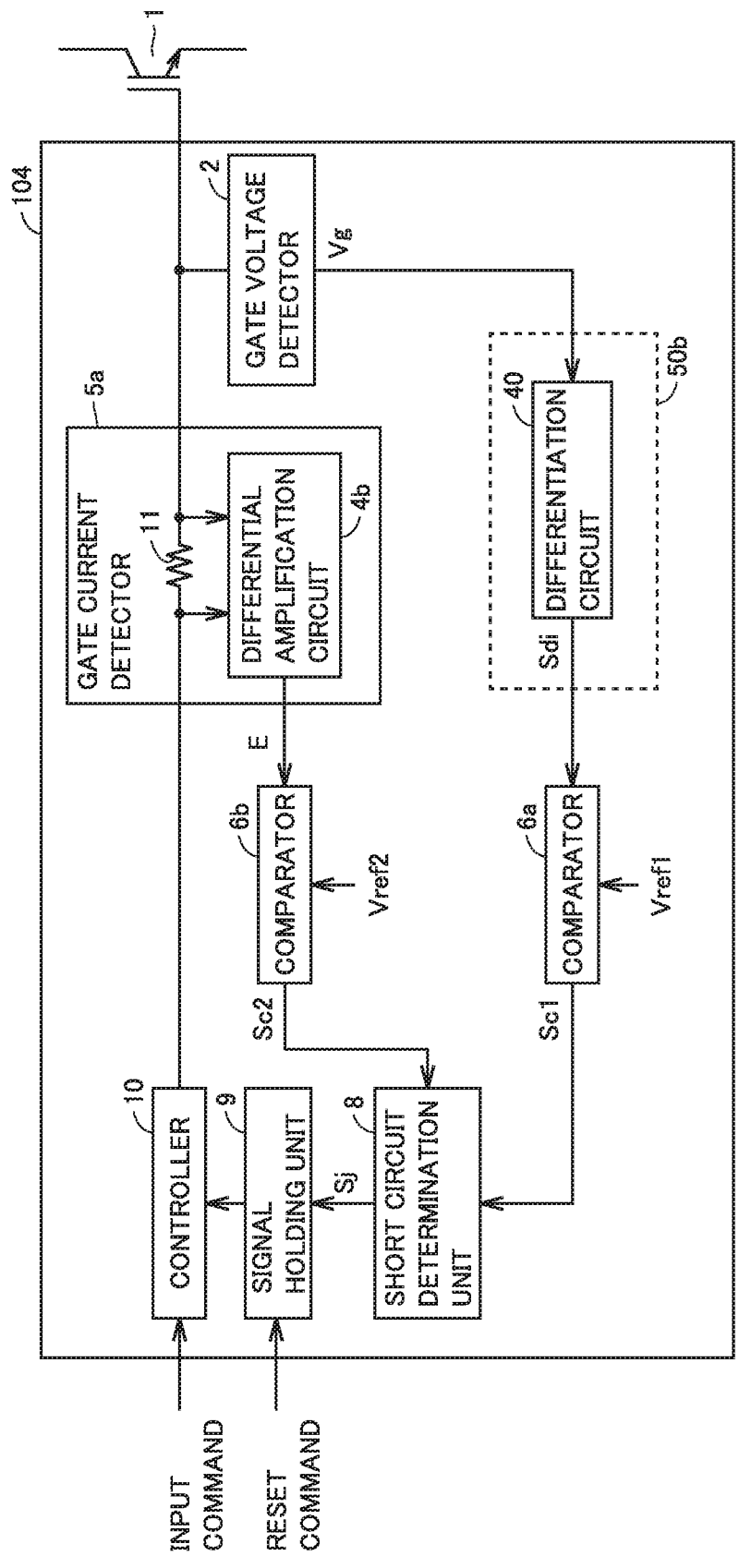
FIG. 17 shows a configuration of a drive circuit combined with a differentiation circuit in the fourth embodiment and the gate current detector in the fifth embodiment.

Although the embodiments have been described above, the features in the above-described embodiments may be combined as appropriate, or may be modified variously. For example, FIG. 17 shows a configuration of a drive circuit 104 combined with differentiation circuit 40 in the fourth embodiment with gate current detector 5a in the fifth embodiment. Drive circuit 104 shown in FIG. 17 can also determine easily and at high speed whether or not semiconductor element 1 is in the short-circuited state. Furthermore, drive circuit 104 does not require a sense cell of the semiconductor element and is applicable to a wide variety of semiconductor elements.

It should be understood that the embodiments disclosed herein are illustrative and non-restrictive in every respect. The scope of the present invention is defined by the terms of the claims, rather than the description of the embodiments above, and is intended to include any modifications within the scope and meaning equivalent to the terms of the claims.

REFERENCE SIGNS LIST 1 semiconductor element; 2 gate voltage detector; 3a to 3e delay circuit; 4a, 4b differential amplification circuit; 5, 5a to 5c gate current detector; 6a, 6b comparator; 8 short circuit determination unit; 9 signal holding unit; 10 controller; 11 gate resistor; 15 ground; 20 operational amplifier; 31, 41, 42 input terminal; 32, 43 output terminal; 40 differentiation circuit; 50, 50a, 50b signal generation circuit; 100 to 104 drive circuit; C0 capacitor; R0 to R4 resistor.

The invention claimed is:

1. A drive circuit for a semiconductor element, comprising:
a controller configured to control open and closed states of the semiconductor element based on a command received from outside;
a gate voltage detector configured to detect a gate voltage of the semiconductor element and generate a voltage detection signal indicating the detected gate voltage;
a gate current detector configured to detect a current flowing into a gate electrode of the semiconductor element and output a current detection value generated by performing a delay operation process;
a signal generation circuit configured to generate, as an output signal, one of a first differential amplification signal of the voltage detection signal and a first delay signal of the voltage detection signal, a second differential amplification signal of the first delay signal and a second delay signal of the voltage detection signal, and a differentiation signal of the voltage detection signal;
a first comparator configured to compare a value of the output signal with a first reference value;
a second comparator configured to compare the current detection value by the gate current detector with a second reference value; and
a short circuit determination unit configured to determine whether or not the semiconductor element is in a short-circuited state, based on a result of comparison by the first comparator and a result of comparison by the second comparator, and generate a determination signal indicating a determination result,
the short circuit determination unit being configured to determine that the semiconductor element is in the short-circuited state, when the value of the output signal is larger than the first reference value and the current detection value is smaller than the second reference value.

2. The drive circuit for the semiconductor element according to claim 1, wherein
the signal generation circuit includes:

a first delay circuit configured to receive the voltage detection signal and generate the first delay signal; and a first differential amplification circuit configured to receive the voltage detection signal and the first delay signal, and generate the first differential amplification signal.

3. The drive circuit for the semiconductor element according to claim 1, wherein the signal generation circuit includes:

a first delay circuit configured to receive the voltage detection signal and output the first delay signal;

a second delay circuit configured to receive the voltage detection signal and output the second delay signal; and a first differential amplification circuit configured to receive the first delay signal and the second delay signal, and generate the second differential amplification signal.

4. The drive circuit for the semiconductor element according to claim 1, wherein the signal generation circuit includes a differentiation circuit configured to receive the voltage detection signal and generate the differentiation signal.

5. The drive circuit for the semiconductor element according to claim 1, wherein the gate current detector includes:

a gate resistor connected between the controller and the gate electrode of the semiconductor element;

a second differential amplification circuit configured to amplify a voltage across the gate resistor to thereby generate a third differential amplification signal; and a third delay circuit configured to receive the third differential amplification signal and generate a third delay signal that is the delayed third differential amplification signal, and the current detection value is a value of the third delay signal.

6. The drive circuit for the semiconductor element according to claim 1, wherein the gate current detector includes:

a gate resistor connected between the controller and the gate electrode of the semiconductor element;

a fourth delay circuit configured to receive a voltage signal of one end of the gate resistor on the semiconductor element side and generate a fourth delay signal that is the delayed voltage signal of the one end of the gate resistor;

a fifth delay circuit configured to receive a voltage signal of the other end of the gate resistor on the controller side and generate a fifth delay signal that is the delayed voltage signal of the other end of the gate resistor; and a second differential amplification circuit configured to receive the fourth delay signal and the fifth delay signal, and amplify a difference between the fourth delay signal and the fifth delay signal to thereby generate a third differential amplification signal, and the current detection value is a value of the third differential amplification signal.

7. The drive circuit for the semiconductor element according to claim 1, further comprising a signal holding unit configured to hold the determination signal when the short circuit determination unit determines that the semiconductor element is in the short-circuited state.

8. The drive circuit for the semiconductor element according to claim 1, wherein the controller is configured to bring the semiconductor element into the open state when the determination signal indicates that the semiconductor element is in the short-circuited state.

9. The drive circuit for the semiconductor element according to claim 1, wherein the first reference value is identical to the second reference value.

* * * * *